United States Patent
Nishi et al.

(10) Patent No.: US 8,816,448 B2
(45) Date of Patent: Aug. 26, 2014

(54) SEMICONDUCTOR DEVICE AND MANUFACTURING METHOD THEREOF

(75) Inventors: Yoshifumi Nishi, Kanagawa-ken (JP); Atsuhiro Kinoshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 709 days.

(21) Appl. No.: 12/609,805

(22) Filed: Oct. 30, 2009

(65) Prior Publication Data

US 2010/0109099 A1 May 6, 2010

(30) Foreign Application Priority Data

Oct. 30, 2008 (JP) ................................. 2008-279253

(51) Int. Cl.
*H01L 29/78* (2006.01)

(52) U.S. Cl.
USPC ............ 257/412; 257/E29.255; 257/E21.135; 257/E21.409; 257/E29.122; 257/734; 438/530; 438/301; 438/664

(58) Field of Classification Search
CPC ............ H01L 29/665; H01L 21/28518; H01L 21/823814; H01L 21/823835; H01L 29/6659; H01L 29/66643; H01L 29/7833
USPC ...................................................... 438/290
See application file for complete search history.

(56) References Cited

U.S. PATENT DOCUMENTS

| | | | |
|---|---|---|---|
| 6,150,243 A | 11/2000 | Wieczorek et al. | |
| 2006/0220131 A1* | 10/2006 | Kinoshita et al. ............. | 257/347 |
| 2007/0057347 A1* | 3/2007 | Ikeda ............................. | 257/616 |
| 2008/0116494 A1* | 5/2008 | Goldbach et al. ............. | 257/288 |
| 2009/0134388 A1 | 5/2009 | Yamauchi et al. | |

FOREIGN PATENT DOCUMENTS

| | | |
|---|---|---|
| JP | 2007-103897 A | 4/2007 |
| JP | 2007-534136 A | 11/2007 |
| JP | 2008-118088 A | 5/2008 |
| JP | 2008-131051 | 6/2008 |
| JP | 2011-519152 A | 6/2011 |

OTHER PUBLICATIONS

Wong, Hoong-Shing et al., "Effective Schottky Barrier Height Reduction Using Sulfur or Selenium at the NiSi/n-Si (100) Interface for Low Resistance Contacts," IEEE Electron Device Letters, vol. 28, No. 12, Dec. 2007, pp. 1102-1104.

Zhao, Q. T. et al., "Tuning of NiSi/Si Schottky barrier heights by sulfur segregation during Ni silicidation," Applied Physics Letters, vol. 86, 062108, 2005, pp. 1-3.

Japanese Office Action issued May 21, 2013 in Patent Application No. 2008-279253 with English Translation.

* cited by examiner

*Primary Examiner* — David Vu
*Assistant Examiner* — Jonathan Han
(74) *Attorney, Agent, or Firm* — Oblon, Spivak, McClelland, Maier & Neustadt, L.L.P.

(57) ABSTRACT

A semiconductor device including a semiconductor substrate, an interface layer formed on the semiconductor substrate including at least $1\times10^{20}$ atoms/cm$^3$ of S (Sulfur), a metal-semiconductor compound layer formed on the interface layer, the metal-semiconductor compound layer including at least $1\times10^{20}$ atoms/cm$^3$ of S in the its whole depth, and a metal electrode formed on the metal-semiconductor compound layer.

8 Claims, 31 Drawing Sheets

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2008-279253, filed Oct. 30, 2008, the entire contents of which are incorporated herein by reference.

BACKGROUND

1. Technical Field

Disclosure generally relates to a semiconductor device and manufacturing method thereof.

2. Description of the Related Art

In order to improve the function of an integrated circuit (IC), it is necessary to improve the performance of a MISFET (Metal Insulator Semiconductor Field Effect Transistor) which is a component of the IC. The performance of the MISFET has so far been improved by scaling down the size of the MISFET.

The junction characteristic of the semiconductor and the metal in a source electrode and a drain electrode is also improved with the scaling down of the MISFET. Metal-semiconductor compounds such as Nickel monosilicide (herein after Nickel silicide or NiSi) are used as a material for a source/drain electrode. Since the resistivity of NiSi is low and the quantity of Si consumed in a silicidation is small, the metal-semiconductor compound is effective as an ultra-thin electrode material. Pt—NiSi (herein after Nickel platinum silicide and NiPtSi), which includes about 5% to 10% of Pt (platinum) mixed with nickel, is also being currently used. NiPtSi is effective in order to improve the thermal stability, the morphology and the process compatibility.

The resistance of the channel decreases as the channel length of the MISFET becomes shorter. Therefore, the resistance in portions other than a channel, i.e., the resistance of source/drain electrodes which is called parasitic resistance, influences the device performance greatly. In a small-sized MISFET, the contact resistance at an electrode metal/Si junction comprises about the half of the parasitic resistance. Therefore, it is effective to reduce the contact resistance in order to reduce the parasitic resistance. The contact resistance is originated in a Schottky barrier formed at the interface of the electrode metal and a semiconductor.

Then, in order to reduce the contact resistance, it is known to use a material with a low Schottky barrier height (SBH) for the carrier bearing current, as a metallic material of an electrode. The SBH of the NiSi/Si interface for electrons is a relatively high value, 0.65 eV. If NiPtSi is used, the Schottky barrier for electrons will become still higher. On the other hand, if a rare earth metal silicide, such as erbium silicide, is used as a metallic material of an electrode, the Schottky barrier for electrons will be reduced to about 0.3 eV.

However, the rare earth metal silicide cannot achieve desirable characteristics from viewpoints of leakage current, resistance, etc. Furthermore, it is necessary to use two metal silicides. That is, one with a low Schottky barrier for electrons is used for a n-type device, and another metal silicide with a low Schottky barrier for holes is used for a p-type device. For this reason, the cost is too high and the technical use of the two metal silicides is difficult.

Introducing impurities into the interface between Si and the electrode of NiSi or NiPtSi has been proposed for reducing the contact resistance. For a p-type MISFET, in order to reduce the Schottky barrier of a hole, introducing group II elements, such as Mg and Ca, is proposed. For an n-type MISFET, in order to reduce an electron Schottky barrier, introducing group VI elements, such as S (sulfur) and Se (selenium), is proposed. Especially by introducing S, it is considered that surface states are formed near the conduction band of Si and the Fermi level is pinned, and the biggest effect may be obtained to reduce the Schottky barrier for electrons.

The following method can be considered to introduce S into a silicide/Si interface. S ions are injected into the portion which forms the electrode on a Si substrate, activation annealing is performed if needed, a thin film of metal, such as nickel, is formed, and after that, the metal is made to react with the substrate silicon (silicidation) by heat treatment to form the silicide electrode. At this time, S segregates to a silicide/Si interface according to what is called a snow-plow effect. Although the method of the above-mentioned snow-plow effect is used also for other impurities, there are several problems, as described below.

First, the diffusion of S in Si is very fast. In an n-type MISFET, donor impurities, such as As and P, are introduced into the portion which forms the electrode on a Si substrate, and activation annealing is performed. However, S is immediately spread in this activation annealing, most of the S escapes away from a substrate face, and a dose loss takes place.

Then, another method of implanting S after activating As and P is also considered. However, when a silicide/Si interface moves toward the substrate during silicidation, S atoms are pushed downward into the substrate due to the snow-plow effect. Since S, an easily diffused impurity, spreads and is distributed into the substrate by this effect, its segregation peak becomes broad. For this reason, S concentration of an interface does not only become high, but it becomes a cause of leakage, since S is distributed deeply.

In order to avoid S density lowering in the interface by a dose loss, another method of enlarging the S injection rate is also considered. However, if an injection rate is enlarged, the defect in a Si substrate will increase, and it will become a cause of leakage.

Furthermore, there is another problem that S diffuses deeply in the substrate since S ions are implanted directly into Si. Especially because S is an element with the almost same mass as Si, it is easy to diffuse S deeply in the substrate. If S diffuses deeply, it will cause junction leakage and so on, and the tolerance of the short channel effect will deteriorate.

In order to avoid the above-mentioned problem, using Se is suggested (reference 1; H.-S. Wong, et al., IEEE Elec. Dev. Lett. 28 vo. 12, pp. 1102-1104 (2007)). Since Se has about 2.4 times the mass of S, the profile at the time of injection does not spread easily, and its diffusion is also small. However, even if Se is used, the Schottky barrier height for electrons is about 0.1 eV. In the technology node below the 22-nm generation where the contact resistance degrades the device performance, using Se is expected to reduce the barrier height further.

On the other hand, the method of injecting S into Si through NiSi and avoiding the above-mentioned problem is also considered in JP-A No. 2008-131051.

In JP-A No. 2008-131051, S ions are implanted after forming NiSi, without performing heat treatment which can rearrange S. In this case, almost all S ions are implanted into interstitial sites and do not form interface states. Moreover, there is another problem that electric resistance may go up as a whole, since Si and NiSi of an electrode field may be damaged.

SUMMARY OF THE INVENTION

Embodiments of this invention are made in consideration of the above-mentioned situation, and can provide a semiconductor device and manufacturing method thereof which reduce the contact resistance of metal-semiconductor compound electrode on the semiconductor substrate.

According to an aspect of the invention, there is provided a semiconductor device including: a semiconductor substrate; an interface layer formed on the semiconductor substrate including at least $1\times10^{20}$ atoms/cm$^3$ of S (Sulfur); a metal-semiconductor compound layer formed on the interface layer including at least $1\times10^{20}$ atoms/cm$^3$ of S in the whole depth; and a metal electrode formed on the metal-semiconductor compound layer.

According to another aspect of the invention, there is provided a method for manufacturing a semiconductor device including: depositing a metal film on a semiconductor substrate; reacting the metal film and the semiconductor substrate to form a metal-semiconductor compound layer by a first heat treatment; ion-implanting S (Sulfur) into the metal-semiconductor compounds layer, on a condition that the range is less than the film thickness of the metal-semiconductor compounds layer; and segregating the ion-implanted S at a vicinity of an interface between the semiconductor substrate and the metal-semiconductor compounds layer by a second heat treatment.

According to another aspect of the invention, there is provided a semiconductor device including: a semiconductor substrate; a channel region formed in the semiconductor substrate; a gate insulating film formed on the channel region; a gate electrode formed on the gate insulating film; source/drain electrodes formed on both sides of the channel region, each electrode being made of a metal-semiconductor compound layers including at least $1\times10^{20}$ atoms/cm$^3$ of S in the whole depth; and interface layers formed between the metal-semiconductor compounds layers and the semiconductor substrate, each including at least $1\times10^{20}$ atoms/cm$^3$ of S.

According to another aspect of the invention, there is provided a method for manufacturing a semiconductor device including: forming a gate insulating film on a semiconductor substrate; forming a gate electrode on the gate insulating film; depositing a metal film on the semiconductor substrate; reacting the metal film and the semiconductor substrate to form metal-semiconductor compound layers on both sides of the gate electrode by a first heat treatment; ion-implanting S into the metal-semiconductor compound layers, on a condition that the range is less than the film thickness of the metal-semiconductor compound layers; and segregating the ion-implanted S at a vicinity of an interface between the semiconductor substrate and the metal-semiconductor compounds layer by second heat treatment.

DETAILED DESCRIPTION

Hereafter, the embodiments of the semiconductor device and the manufacturing method thereof are explained, referring to drawings. A "range" is synonymous with the Projected Range (Rp) in an ion implantation process throughout this specification.

First Embodiment

A semiconductor device according to a first embodiment has a semiconductor substrate, an interface layer including at least $1\times10^{20}$ atoms/cm$^3$ of S (Sulfur) formed on the semiconductor substrate, a metal-semiconductor compound layer including at least $1\times10^{20}$ atoms/cm$^3$ of S in the whole depth formed on the interface layer, and a metal electrode formed on the metal-semiconductor compounds layer. Hereinafter, as an example, the semiconductor substrate is described as being a Si substrate, the metal-semiconductor compound layer as being a NiSi layer, and the metal electrode as being a contact electrode.

Figure 1:
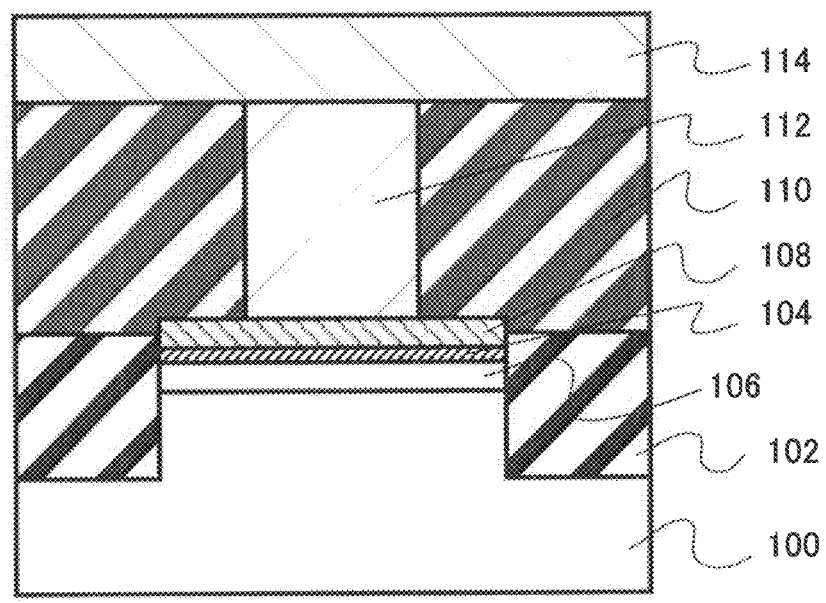
FIG. 1 is a sectional view showing a semiconductor device according to a first embodiment.

FIG. 1 is a sectional view showing a semiconductor device according to a first embodiment. In this, device isolation regions 102 are formed in a p-type Si substrate 100 in which, for example, B (boron) is doped to about $10^{15}$ atoms/cm$^3$. The device isolation region 102 is, for example, STI (Shallow Trench Isolation) embedded a silicon oxide film.

Next, an interface layer 104 is formed on the Si substrate 100 sandwiched by the device isolation regions 102. The interface layer 104 includes at least $1\times10^{20}$ atoms/cm$^3$ of S. An n-type impurity layer (or n-type diffusion layer) 106 in which As is doped to about $10^{19}$ atoms/cm$^3$~$10^{20}$ atoms/cm$^3$, for example, is formed at the Si substrate 100 side of the interface layer 104. P, Sb and so on may also be used as dopants in the n-type impurity layer 106.

A NiSi layer 108 is formed on the interface layer 104. The NiSi layer 108 includes at least $1\times10^{20}$ atoms/cm$^3$ of S in the whole depth. In other words, S concentration in the NiSi layer 108 obtained by SIMS (Secondary Ionization Mass Spectrometer) is $1\times10^{20}$ atoms/cm$^3$ or more.

An interlayer insulator 110, made of such as Si oxide, is formed on the device isolation region 102 and NiSi layer 108. A contact electrode 112 is formed on the NiSi layer 108 in such a manner as to extend through the interlayer insulator 110. The contact electrode 112 is made of a TiN barrier metal and W, for example. Furthermore, a Cu wiring layer 114 for electrical connection with other devices or the outside is formed on the contact electrode 112. Metal such as Al, AlSiCu and so on are available as materials forming the contact electrode 112 and the wiring layer 114 in addition to TiN, W, and Cu described above. Additionally, the contact electrode 112 and the wiring layer 114 may be made of the same material and may form an integral structure.

According to this embodiment, since S atoms are highly concentrated at the (NiSi layer/semiconductor) interface, S atoms form surface states near the conduction band of Semiconductor. Then, the Fermi level is pinned, and the Schottky barrier for electrons significantly decreases. Especially, if the semiconductor is Si, the Schottky barrier height (SBH) drops below 0.01 eV, which is lower than the SBH of any metal generally used. Because an interface resistance of metal/semiconductor interface depends on SBH in an exponential manner, the interface resistance can be greatly reduced by by introducing S. For this reason, a low-resistance contact structure is feasible.

Moreover, at least $1\times10^{20}$ atoms/cm$^3$ of S being included within the silicide layer, i.e. NiSi layer 108, causes grain boundaries to be stabilized and prevents re-silicidation. Consequently, thermal stability of the silicide layer is improved. Because S atoms within the silicide layer are terminally bonded to dangling bonds of Si atoms at an interface of silicide grain boundaries, grain boundaries become stabilized. If there is at least $1\times10^{20}$ atoms/cm$^3$ of S, then the S atoms may be terminally bonded to Si atoms through the whole grain boundaries. For this reason, a contact structure with high thermal stability is feasible.

Then, silicide layer includes at least $1\times10^{20}$ atoms/cm$^3$ of S in the whole depth. Consequently, S atoms are also terminally bonded to dangling bonds of Si atoms at a surface of the silicide layer. It may prevent those Si dangling bonds from being terminated by oxygen atoms, and hence the formation of highly-resistive oxide layer on the silicide is prevented. For this reason, the increase and the variation of the resistance at the interface of silicide layer and the contact electrode are well suppressed.

Next, a method of manufacturing the semiconductor device of this embodiment is explained. The method includes depositing a metal film on a semiconductor substrate, reacting the metal film and the semiconductor substrate to form a metal-semiconductor compound layer by a first heat treatment, ion-implanting S into the metal-semiconductor compounds layer on a condition that the range is less than the film thickness of the metal-semiconductor compound layer, and segregating the ion-implanted S at a vicinity of an interface between the semiconductor substrate and the metal-semiconductor compounds layer by second heat treatment. Here, as an example, the semiconductor substrate is described as being a Si substrate, the metal film as being a Ni film, and the metal-semiconductor compounds layer as being a NiSi layer, similar to the above described semiconductor device of FIG. 1. FIGS. 2 to 7 are cross sectional views of manufacturing processes of the method of manufacturing a semiconductor device of the embodiment.

Figure 2:
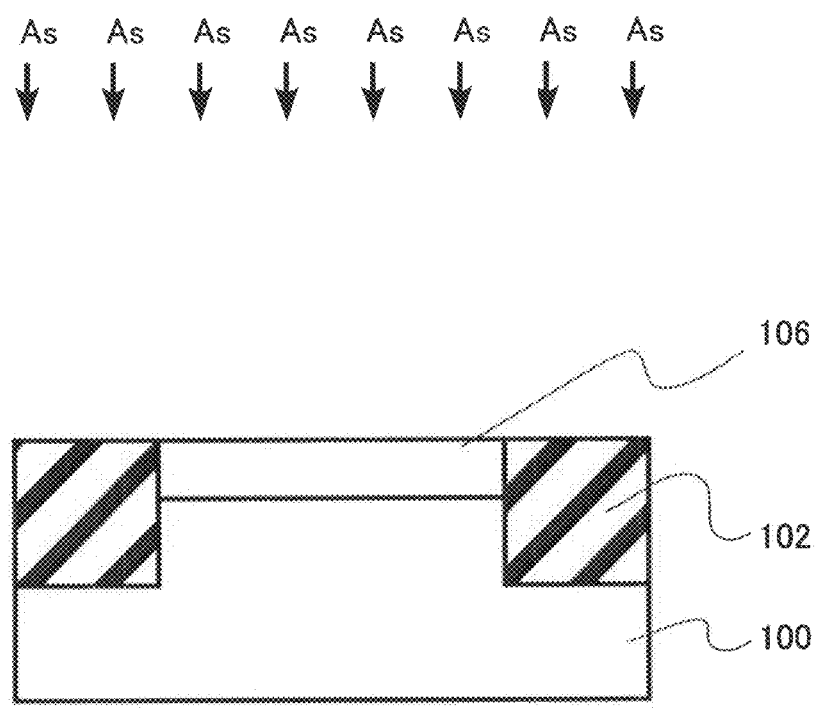
FIG. 2 to 7 are sectional views showing a manufacturing process of the semiconductor device according to the first embodiment.

First, as shown in FIG. 2, a p-type silicon (Si) substrate 100 having a (100) plane direction in which B (boron) is doped with about $10^{15}$ atoms/cm$^3$ is prepared. In the p-type Si substrate 100, device isolation regions (STI (Shallow Trench Isolation)) 102 made of silicon oxide are formed with a distance between them. After that, n-type impurity layer 106 is formed by ion-implanting an impurity such as As into a portion of the Si substrate 100 between the isolation regions 102.

Figure 3:
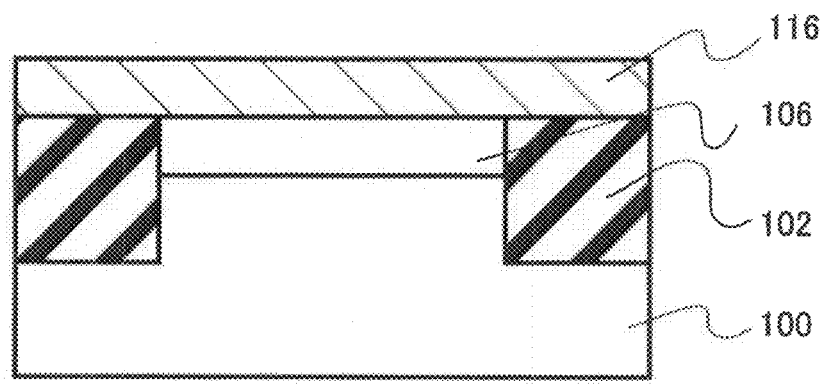

Next, as shown in FIG. 3, an Ni film 116 having a thickness of about 8 nm is deposited on Si substrate 100 by, for example, sputtering, over impurity layer 106.

Figure 4:
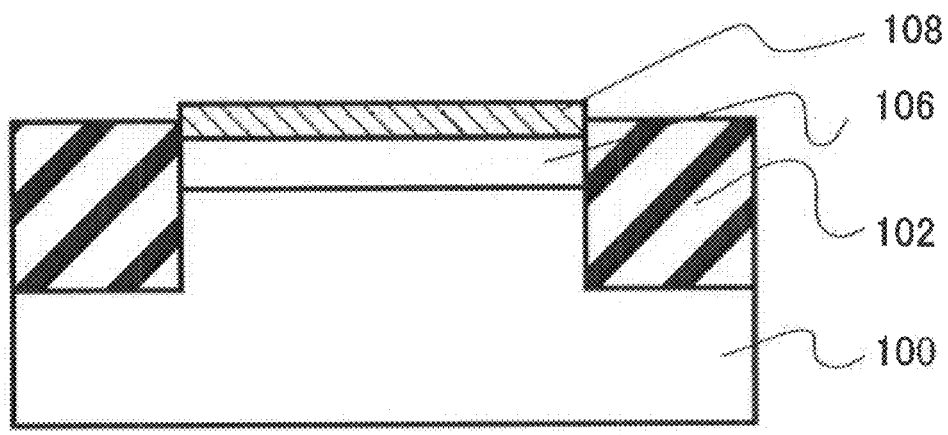

As shown in FIG. 4, a first heat treatment, such as annealing at 450° C. for 1 minute in an inert atmosphere by RTA (Rapid Thermal Annealing), is performed. This heat treatment makes the Ni film 116 and the Si substrate 100 react with each other to form silicide, thereby forming an NiSi layer 108 to a thickness of, for example, about 15 nm. After that, the unreacted and surplus Ni film 116 is selectively removed, for example, using chemical etching.

Figure 5:
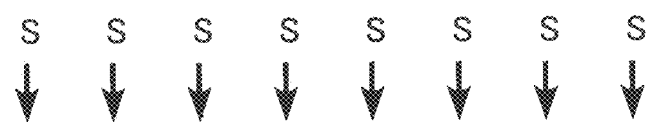
Figure 5:
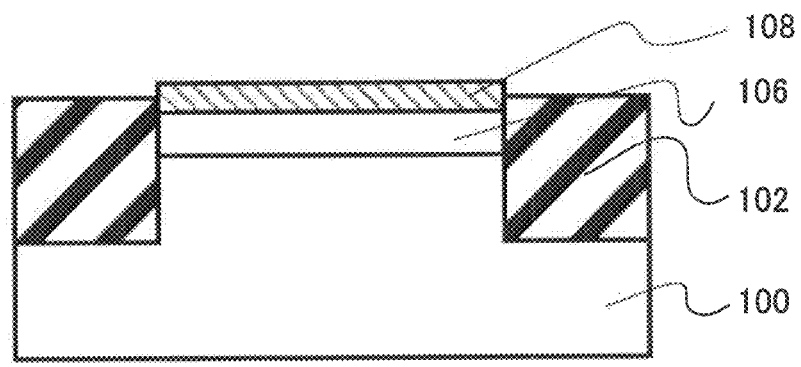

Next, as shown in FIG. 5, S is ion-implanted into the NiSi layer 108. S is implanted with an acceleration voltage such that Projected Range (Rp) is less than the film thickness of the NiSi layer 108. That is, it is set up that a concentration peak of S atoms as implanted is within the NiSi layer 108.

For instance, in the case of the film thickness of the NiSi layer 108 being 15 nm, if S is implanted with an acceleration voltage of 10 keV, it is possible that Rp is 6 nm, which is less than the film thickness of the NiSi layer 108. Different from the case that S is implanted into Si, in this embodiment, S is implanted into NiSi layer 108. It means that NiSi layer 108 serves as stopping layer of S. That is, it may prevent S atoms from diffusing into the Si substrate. It is possible to provide a shallow and sharp S profile.

Figure 6:
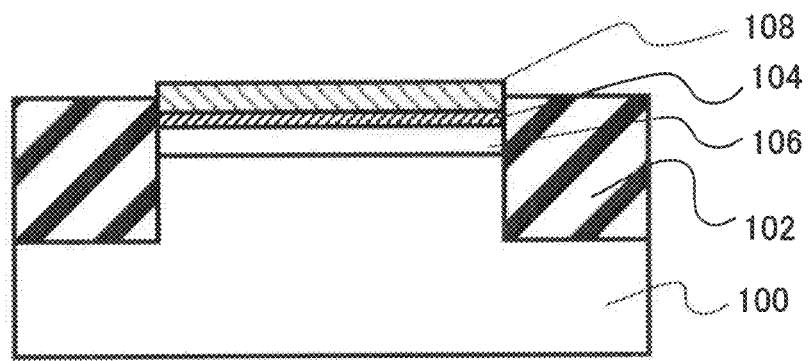

As shown in FIG. 6, a second heat treatment, such as annealing at 500° C. for about 1 minute in an inert atmosphere by RTA, is performed. This heat treatment repairs defects within Si or NiSi caused by S ion-implanting, and at the same time relocates the implanted S towards an energetically stable state.

With this second heat treatment, the ion-implanted S is segregated at a vicinity of an interface between the Si substrate 100 and the NiSi layer 108 where S atoms are energetically more stable than in NiSi. S atoms are terminally bonded to Si atoms at the interface between the Si substrate 100 and the NiSi layer 108. Then, an interface layer 104 with high S concentration is formed between NiSi layer 108 and Si substrate 100. S atoms are also terminally bonded to Si atoms at a grain boundary or an interface of NiSi crystals. That is, S atoms are also terminally bonded to Si atoms, inside or on a surface of the NiSi layer 108.

During this second heat treatment, the omission of Ni film 116 and the high thermal stability of NiSi layer 108 prevent further silicidation at the NiSi layer/Si substrate, thereby S atoms do not move downward in the substrate. It means that diffusion of S is very little in the substrate, and segregates at a stable NiSi/Si interface. A sharp segregated S peak at the vicinity of the interface is obtained. As described herein below, the interface layer 104, a silicon region on the interface, is doped with high S concentration, thereby decreasing the Schottky barrier.

The interface layer 104 includes at least $1\times10^{20}$ atoms/cm$^3$ of S, by the S ion-implanting followed by the second heat treatment. The interface layer 104 means that the silicon region on the interface where S concentration obtained by SIMS is $1\times10^{20}$ atoms/cm$^3$ or more. It is possible to provide a contact structure with good ohmic property.

It is desirable that NiSi layer 108 includes at least $1\times10^{20}$ atoms/cm$^3$ of S in the whole depth, by the S ion-implanting followed by the second heat treatment because Si atoms at grain boundaries or the surface of NiSi layer 108 are sufficiently terminally bonded by S atoms.

Figure 7:
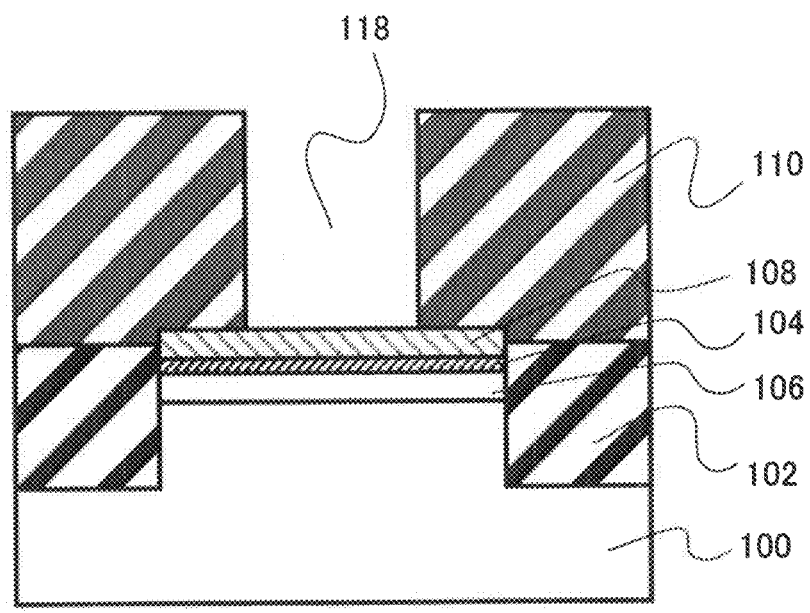

As shown in FIG. 7, an interlayer insulator 110 made of, for example, Si oxide is deposited on Si substrate 100 by, for example, a CVD (Chemical Vapor Deposition) method. After that, contact hole 118 is opened in the interlayer insulator 110, by an etching method such as heretofore known lithography techniques and reactive ion etching (hereinafter RIE).

After that, contact electrode 112 made of, for example a TiN barrier metal and W is formed by, for example, CVD. Then, wiring layer 114 made of Cu, for example, is formed on contact electrode 112, and the semiconductor device with the contact structure shown in FIG. 1 is manufactured.

A contact structure having an n-type impurity layer 106 is explained as an example. It is desirable to have n-type impurity layer 106 from a standpoint of controlling junction leakage etc. between contact electrode 112 and Si substrate 100. However, from a stand point of reducing contact resistance, an n-type impurity layer 106 is not necessary. It is sufficient that NiSi layer 108 and Si substrate 100 contact each other through interface layer 104.

Figure 8:
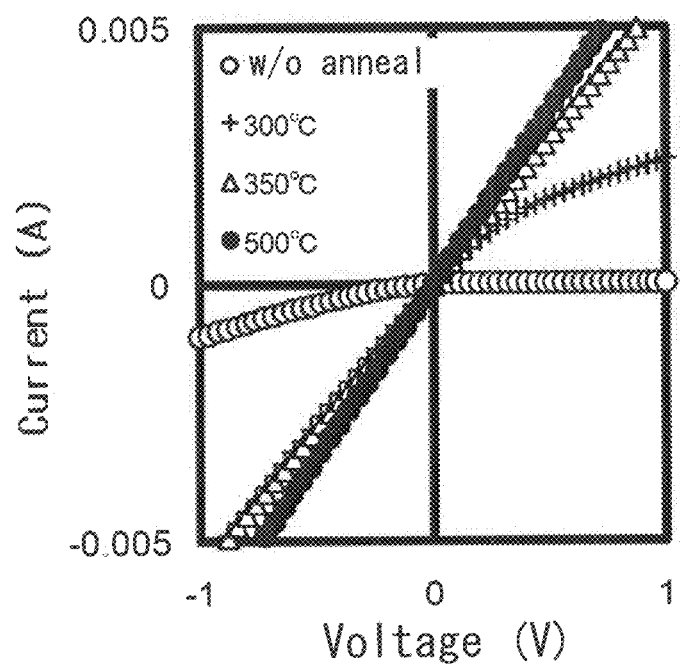
FIG. 8 shows Schottky diode characteristics at various annealing temperatures.

FIG. 8 shows Schottky diode characteristics of the device of the embodiment, which depend on the conditions in a second heat treatment. S was implanted with 10 keV, $5\times10^{14}$ atoms/cm$^2$ into an NiSi layer having a thickness of 15 nm formed on n-type Si substrate. The cases in which annealing, as the second heat treatment, was not performed (white circle), annealing was performed at 300° C. (cross), at 350° C. (white triangle), and at 500° C. (black circle) as the second heat treatment are compared. Also, the n-type impurity layer 106 was not formed.

Asymmetrical rectifying properties by Schottky characteristics are observed in the cases in which annealing was not performed and in the case in which annealing was performed at 300° C. It is also observed that rectifying properties disappeared and ohmic properties are obtained by raising anneal temperature to 350° C., and 500° C. Drawing a comparison between 350° C. and 500° C., the 500° C. case has lower resistance and much more current. This is because, compared with the 350° C. case in which resistance induced from defects within NiSi or Si made of S ion-implanting is observed, the defects are repaired and resistance is reduced in 500° C. case.

It is desirable that temperature at second heat treatment is higher than first heat treatment performing silicidation thereof, to promote relocation of S toward stable state, and to repair defects within NiSi and Si.

Figure 9:
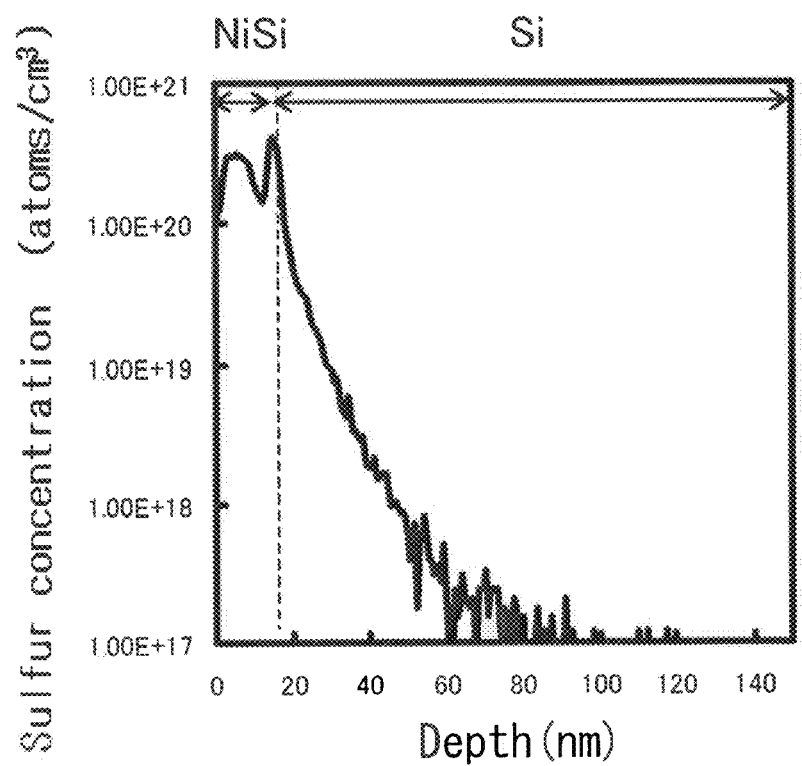
FIG. 9 shows the SIMS profile of S according to the first embodiment.

FIG. 9 shows an S concentration profile of the device of the embodiment. S was implanted with 10 keV to a dose of $5\times10^{14}$ atoms/cm$^2$ into an NiSi layer having a thickness of 15 nm formed on a Si substrate. Heat treatment at 500° C. was performed on this sample. The S profile of this sample was obtained by Back-side SIMS.

It can be seen that the interface layer segregated S in high concentration of at least $1\times10^{20}$ atoms/cm$^3$ between NiSi and Si. In the related art, S was implanted into Si substrate before forming NiSi layer, and due to diffusion of S and dose loss, the interface layer including S in a high concentration of at least $1\times10^{20}$ atoms/cm$^3$ could not be formed.

It is also clear in FIG. 9 that the silicide layer includes at least $1\times10^{20}$ atoms/cm$^3$ of S throughout its depth (in the who region). As described the above, due to this S in concentrated amounts, dangling bonds at silicide grain boundaries are terminally bonded and grain boundaries are stabilized, reformation of silicide is controlled and thermal stability is improved.

Figure 10:
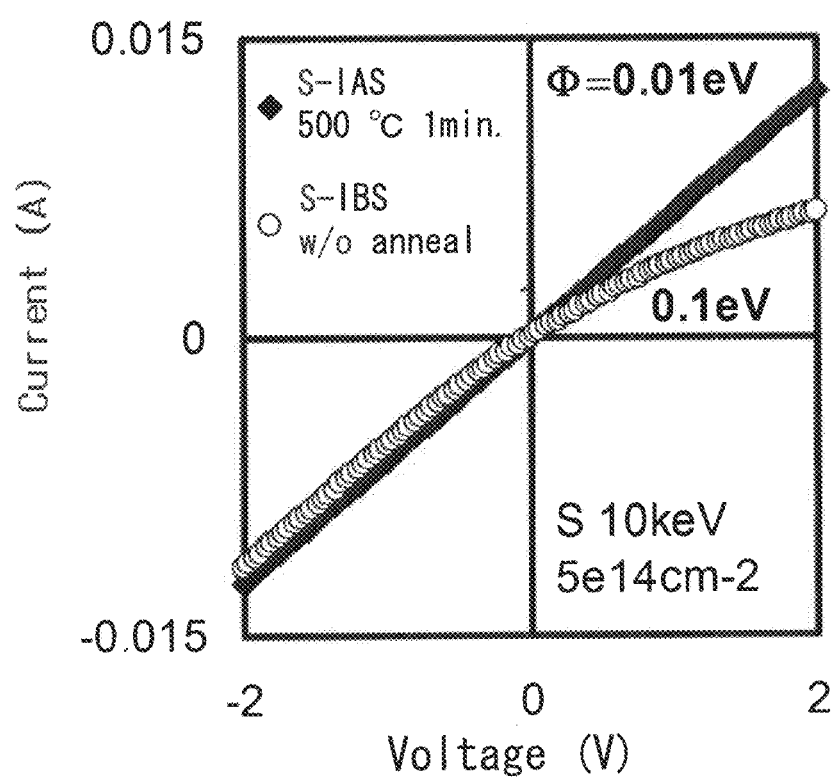
FIG. 10 shows Schottky diode characteristics of S-IAS and S-IBS.

FIG. 10 shows a relationship between the process order of S ion-implantation and Schottky diode characteristics. One sample was an n-type NiSi Schottky diode in which $5\times10^{14}$ atoms/cm$^2$ of S was implanted with 10 keV into Si, and thereafter NiSi layer was formed (S-IBS; Sulfur implantation before silicidation, white circle). Another sample was an n-type NiSi Schottky diode where S was implanted with same condition after forming NiSi layer, and heat treatment (annealing) was performed at 500° C. for 1 minute (S-IAS; Sulfur implantation after silicidation, black square). The I-V characteristics at room temperature of these samples were compared. In case of S-IBS, drive-in anneal before silicidation was not performed. There were no n-type diffusion layers in these samples.

Asymmetrical rectifying property by Schottky characteristic is observed in the case of S implantation before formation of NiSi. To this, perfectly linear and symmetrical ohmic property is obtained in case of S implantation after formation of NiSi. Because the latter had higher S concentration at NiSi/Si interface, SBH is sufficiently controlled and a Schottky characteristic cannot be seen at room temperature.

In fact, SBH of the latter is calculated by temperature property, and a value below 0.01 eV was obtained. This value is lower than any SBH of silicide known in general as experimental value, up to now. Alternatively, in the former case, SBH was 0.1 eV, which indicates that S concentration at the interface was not enough and the Schottky characteristic remained.

Figure 11:
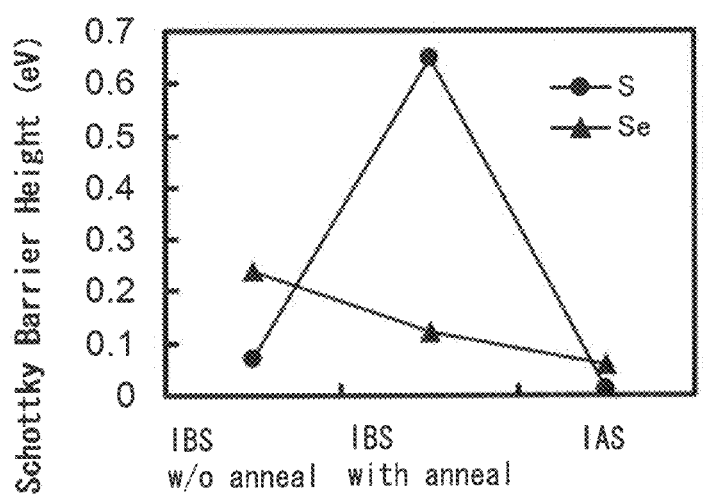
FIG. 11 shows Schottky barrier heights of various implantation processes.

FIG. 11 shows SBH dependency of the ion-implanting element and process, in other words, NiSi SBH for an electron in cases of S-IBS and Se-IBS with or without drive-in annealing before silicidation, and S-IAS and Se-IAS. The SBH of S-IBS and Se-IBS was obtained reference 1, mentioned above. It can be seen that the lowest SBH is obtained by this embodiment, namely in case of S-IAS.

The case in which the metal-semiconductor compound is NiSi is mentioned above. However, similar effects are obtained in cases of other silicides such as Pt-added NiSi (NiPtSi) in which 5-50 atomic % Pt was added to Ni, PtSi, PdSi and so on. Especially, NiPtSi is desirable to make it possible to increase thermal stability, film quality and process controllability.

Second Embodiment

A semiconductor device by a second embodiment has a semiconductor substrate, a channel region formed in the semiconductor substrate, a gate insulating film formed on the channel region, a gate electrode formed on the gate insulating film, source/drain electrodes formed on both sides of the channel region, made of metal-semiconductor compound layers including at least $1\times10^{20}$ atoms/cm$^3$ of S in the whole depth, and interface layers formed between the metal-semiconductor compound layers and the semiconductor substrate, including at least $1\times10^{20}$ atoms/cm$^3$ of S.

The above description regarding to the semiconductor substrate/metal semiconductor compound interface used for contact structure in the first embodiment applies to source/drain electrodes of MISFET in the second embodiment. Thus, repetitive description with first embodiment will not be given. Hereinafter, as an example, the case of an n-type MISFET is described, a Si substrate is described as the semiconductor substrate, and a NiSi layer is described as the metal-semiconductor compound layer.

Figure 12:
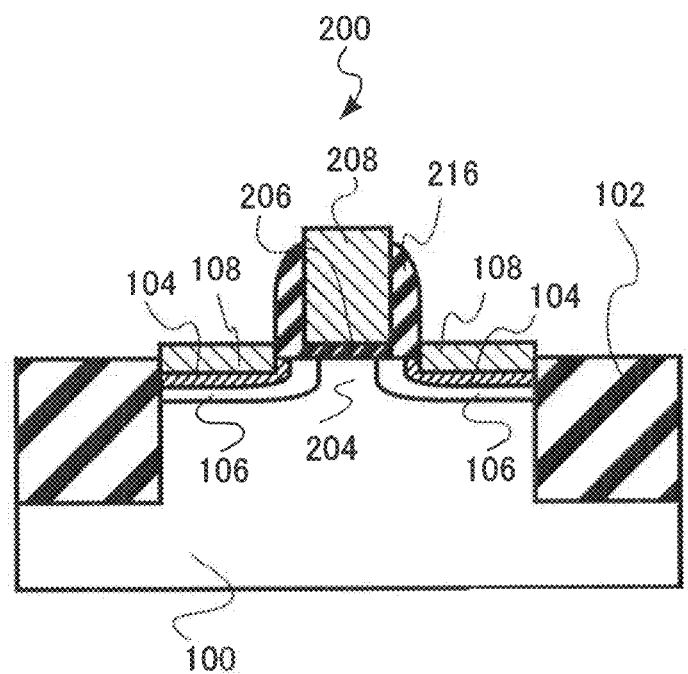
FIG. 12 is a sectional view showing a semiconductor device according to a second embodiment.

FIG. 12 is a sectional view showing a semiconductor device according to the second embodiment. This device, for example, has n-type MISFET 200 formed on a p-type silicon substrate 100 in which B (boron) is doped to about $10^{15}$ atoms/cm$^3$.

The device isolation regions 102 are formed in this device. The device isolation regions 102 are, for example, STI (Shallow Trench Isolation)) embedded silicon oxide film.

N-type MISFET 200 has a channel region 204 formed on the silicon substrate 100, a gate insulating film 206, e.g. silicon oxide film, formed on the channel region 204, and a gate electrode 208, e.g. having gate length 22 nm or less, formed on the gate insulating film 206.

Source/drain electrodes are formed on both sides of the channel region 204, made of NiSi layers 108. Interface layers 104 are formed between NiSi layers 108 and silicon substrate 100, including S in high concentration. Sidewall insulator 216, e.g. silicon nitride film, is formed on both sides of gate electrode 208.

Here, NiSi layers 108 include at least $1 \times 10^{20}$ atoms/cm$^3$ of S in the whole depth. Interface layers 104 include at least $1 \times 10^{20}$ atoms/cm$^3$ of S.

N-type impurity layers 106 in which As is doped with $10^{19}$ atoms/cm$^3$~$10^{20}$ atoms/cm$^3$, for example, is formed at the Si substrate 100 side of the interface layer 104. P, Sb and so on may also be used as dopants instead of As in the n-type impurity layer 106.

Here, gate electrode 208 of n-type MISFET 200 has what is called the FUSI (Fully silicided) structure that is made of NiSi in the same manner as source/drain electrodes. However, the embodiment is not limited to the FUSI structure for gate electrode 208. For example, a stack structure of polysilicon and metal silicide, a stack structure of metal and metal silicide, or a metal gate structure in which the entire gate electrode is made of metal may be also employed. In this case, as a metal material, for example, a single metal of Ti, Ta, W or Al or nitride, carbide, or the like of those metals can be applied. A three-layered stack structure of a single metal or nitride, carbide, or the like of those metals, barrier metal such as WN, silicide such as NiSi, NiPtSi and so on may be employed.

Here, silicon oxide is described as an example of gate insulating film 206. However, it is desirable to use a High-K insulator instead of silicon oxide to improve MISFET performance. For example, oxide, silicate, nitride silicate of Hf, Zr, Al, rare earth element such as La, and mixture thereof or lamination thereof can be applied.

According to the device of the embodiment, the contact resistance between source/drain electrodes and semiconductor decreases dramatically. Consequently, parasitic resistance of the MISFET is controlled and driving ability is improved. Furthermore, due to at least $1 \times 10^{20}$ atoms/cm$^3$ of S within the silicide layer, this embodiment may provide a MISFET with high thermal stability.

Si dangling bonds may be prevented from being terminated by oxygen, and hence the formation of highly-resistive oxide layer on the silicide is prevented. For this reason, the increase of the resistance at an interface between silicide layers of source/drain electrodes and contact electrodes connecting the silicide layers to an upper wiring layer is suppressed. And parasite resistance of MISFET is suppressed. The variation of the resistance is also suppressed.

Next, a method of manufacturing the semiconductor device according to the second embodiment is explained. The method of the semiconductor device of this embodiment includes forming a gate insulating film on the semiconductor substrate, forming a gate electrode on the gate insulating film, depositing a metal film on the semiconductor substrate, reacting the metal film and the semiconductor substrate to form metal-semiconductor compound layers on both sides of the gate electrode by a first heat treatment, ion-implanting S into the metal-semiconductor compounds layers on a condition that the range is less than the film thickness of the metal-semiconductor compounds layers, and segregating the ion-implanted S at a vicinity of an interface between the semiconductor substrate and the metal-semiconductor compounds layer by a second heat treatment.

FIGS. 13 to 16 are cross sectional views of manufacturing processes of the method of manufacturing a semiconductor device of the embodiment. Repetitive description with first embodiment will not be given.

First, in a p-type silicon substrate 100 in which B (boron) is doped to about $10^{15}$ atoms/cm$^3$, device isolation regions 102 are formed. After that, a gate insulating film 206, made of silicon oxide for example, is formed on silicon substrate 100.

Next, for example, a polysilicon film serving as a gate electrode 208 is deposited on gate insulating film 206 by a low pressure chemical vapor deposition (hereinbelow, also called LP-CVD). The gate insulating film 206 and gate electrode 208 are patterned using a lithography technique and an etching technique such as reactive ion etching (hereinbelow, also called RIE).

Figure 13:
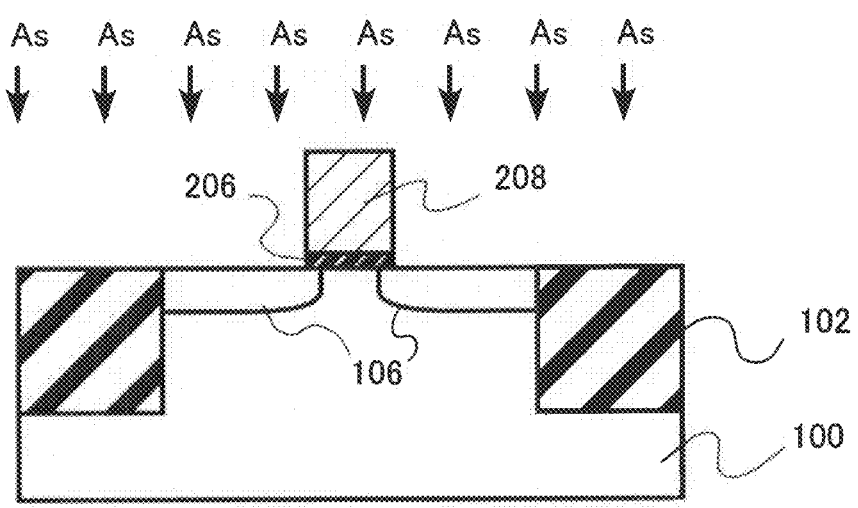
FIG. 13 to 16 are sectional views showing a manufacturing process of the semiconductor device according to the second embodiment.

Next, as shown in FIG. 13, As is introduced into the Si substrate 100 using the gate electrode 208 as a mask, and a drive-in anneal is performed. By these operations, an n-type impurity layer 106 with, for example, about $1 \times 10^{20}$ atoms/cm$^3$ of As is formed. Ion implanting after forming sidewall insulator is also possible.

Figure 14:
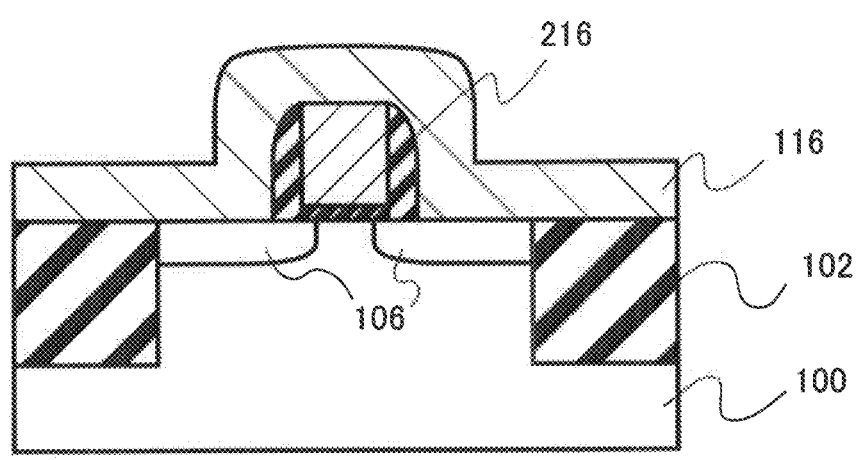

Next, as shown in FIG. 14, a silicon nitride film is deposited by the LP-CVD and etched back by RIE so that the silicon nitride film remains only on side faces of the gate electrodes 208. Gate side-wall insulating film 216 is formed. Next, an Ni film 116 is formed on Si substrate 100 by sputtering, for example. That is, it is deposited so that Ni film 116 contacts with the source and drain region of the n-type MISFET.

Figure 15:
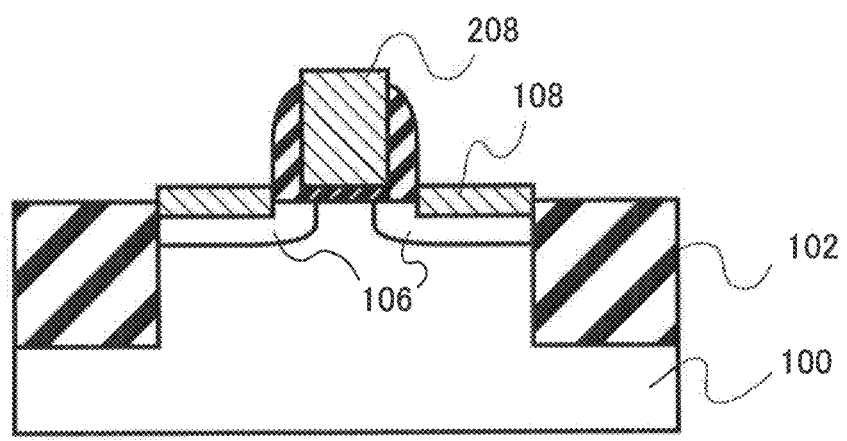

As shown in FIG. 15, q first heat treatment, such as annealing at 450° C. for 1 minute by RTA, is performed, and NiSi layer 108 is formed by silicidation of Ni film 116. At the same time, all of gate electrode 208 made of poly silicon becomes NiSi. After that, the unreacted and surplus Ni film 116 is selectively removed with a chemical etch. This NiSi layer 108 serves as source/drain electrode of n-type MISFET.

Figure 16:
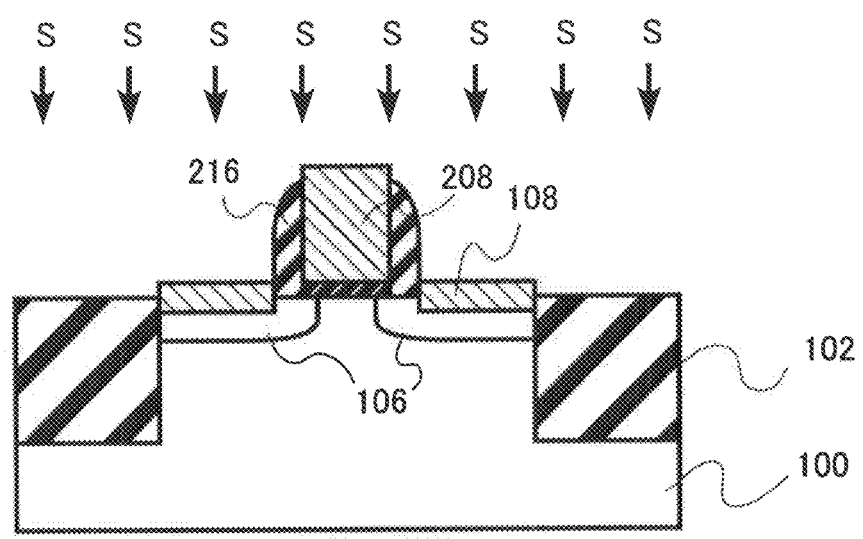

As shown in FIG. 16, S is ion-implanted into the NiSi layer 108 using gate electrode 208 and side-wall insulator 216 as a mask. S is implanted with such an acceleration voltage that a Projected Range (Rp) is less than the film thickness of the NiSi layer 108.

After that, a second heat treatment, such as annealing at 500° C. for about 1 minute, is performed. This heat treatment repairs damage such as defects within Si or NiSi caused during S ion-implanting, and at the same time relocates the implanted S toward energetically stable state.

Then, by this second heat treatment, an interface layer 104 with highly doped S is formed between NiSi layer 108 and Si substrate 100. S atoms are terminally bonded to Si atoms at the interface of NiSi crystals, inside or on the surface of the NiSi layer 108. As described the above, the n-type MISFET shown in FIG. 12 is manufactured.

It is also desirable in this embodiment that interface layer 104 includes at least $1 \times 10^{20}$ atoms/cm$^3$ of S, by S ion-implantation and the second heat treatment. A source/drain structure having good ohmic property can be achieved.

It is desirable that NiSi layer 108 includes at least $1\times10^{20}$ atoms/cm$^3$ of S in the whole depth, by S ion-implanting and second heat treatment. By the operation, Si atoms at grain boundaries or surface of NiSi layer 108 are sufficiently terminally bonded by S atoms. It is possible to provide a manufacturing method of a thermally stable MISFET with lower parasitic resistance and lower resistance variation.

As described in the first embodiment, similar effects are obtained in the second embodiment by using other metal semiconductor compounds such as Pt-added NiSi (NiPtSi) in which 5-50 atomic % Pt was added to Ni, PtSi, PdSi and so on.

Third Embodiment

A semiconductor device according to a third embodiment includes an n-type extension layer. It is same as second embodiment except for n-type extension layer. Thus, repetitive description with the second embodiment will not be given.

Figure 17:
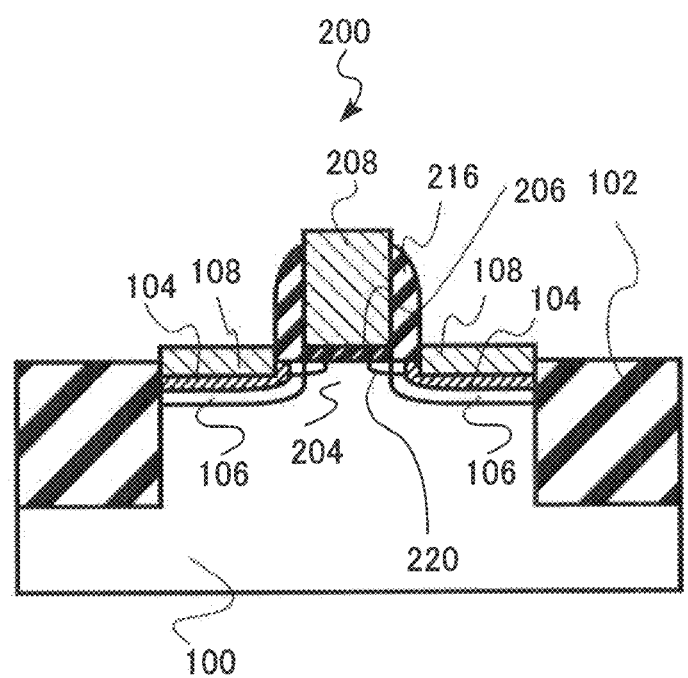
FIG. 17 is a sectional view showing a semiconductor device according to a third embodiment.

FIG. 17 is a sectional view showing a semiconductor device according to the third embodiment. This n-type MISFET 200 has n-type extension layer 220, with As as an impurity for example, sandwiching channel region 204. For example, As is introduced by tilt ion-implantation before forming the n-type impurity layer 106 by As ion-implantation in second embodiment.

This embodiment may provide, in addition to the function and effect of second embodiment, a high-spec n-type MISFET by optimizing conditions of a concentration profile of the n-type extension layer 220 and n-type impurity layer 106.

Fourth Embodiment

A semiconductor device according to a fourth embodiment is what is called an n-type segregated Schottky transistor. This n-type segregated Schottky transistor does not have a n-type impurity layer, but has at least one n-type impurity selected from As, P and Sb, added to S, and is segregated at the vicinity of the interface and contained at least $1\times10^{20}$ atoms/cm$^3$ in an interface layer. Thus, the interface layer 230 contains both the n-type impurity and S. It is same as second embodiment except for no n-type impurity layer and segregated n-type impurity. Thus, repetitive description with second embodiment will not be given.

Figure 18:
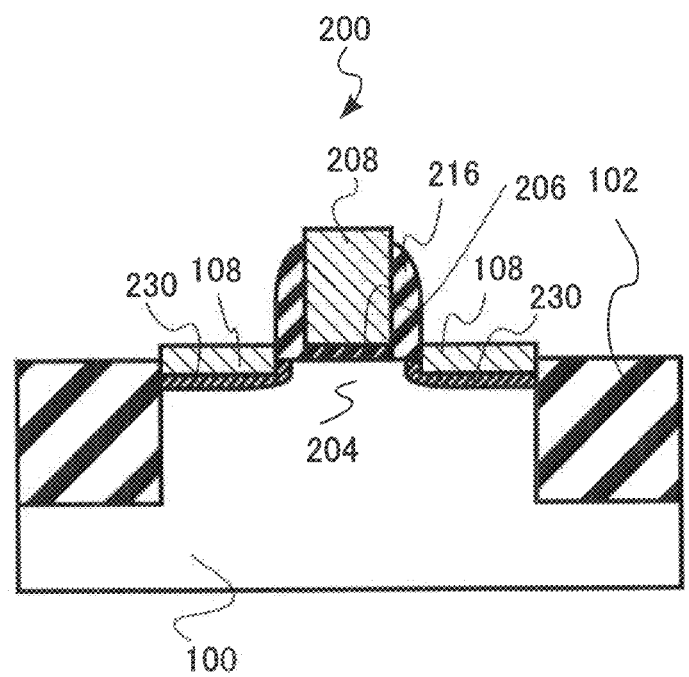
FIG. 18 is a sectional view showing a semiconductor device according to a fourth embodiment.

FIG. 18 is a sectional view showing a semiconductor device according to the fourth embodiment. This n-type MISFET 200 has interface layer 230 sandwiching channel region 204. At least one n-type impurity such as As, P and Sb, at a large concentration of at least $1\times10^{20}$ atoms/cm$^3$ is segregated at the vicinity of the interface. The interface layer 230 contains both the n-type impurity and S. The interface layer 230 includes at least $1\times10^{20}$ atoms/cm$^3$ of the n-type impurity and at least $1\times10^{20}$ atoms/cm$^3$ of S.

Figure 19:
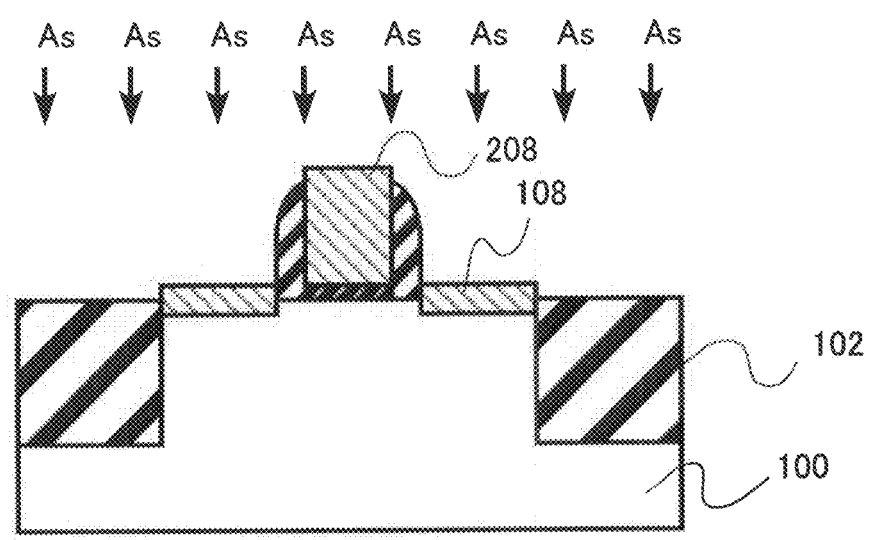
FIG. 19 is sectional view showing a manufacturing process of the semiconductor device according to the fourth embodiment.

FIG. 19 is a cross sectional view of manufacturing processes of the method of manufacturing a semiconductor device of the embodiment. For example, As is introduced into NiSi layer 108 by ion-implantation, before S implantation, as in the second embodiment. With this second heat treatment, the ion-implanted As and S are segregated at a vicinity of an interface between the Si substrate 100 and the NiSi layer 108 where these atoms are energetically more stable than in NiSi. Then, an interface layer 104 containing both As and S is formed between NiSi layer 108 and Si substrate 100.

This embodiment may provide a MISFET with low contact resistance, by image-force effect ("Metal-Semiconductor Contacts" 2nd edition, E. H. Rhoderick and R. H. Williams, Oxford Science Publications (1988)) of high-concentration donor As in the interface layer, in addition to the function and effect of the second embodiment such as lower effect of SBH by S.

According to manufacturing method of this embodiment, the process becomes simpler than the second embodiment because As and S are introduced into the NiSi layer, and a drive-in anneal is performed. Drive-in temperature is reduced to 500° C. and it can suppress S diffusion because As is introduced after formation of NiSi layer.

Here, As is introduced into NiSi layer as manufacturing method of the device of FIG. 18. However, it is possible in the manufacturing method of the device of FIG. 18 that As is introduced into a shallower region than the thickness of NiSi layer and is segregated by the snow-plow effect.

Fifth Embodiment

A semiconductor device according to a fifth embodiment is called an n-type Schottky transistor. It is same as the second embodiment except for a Schottky transistor without n-type impurity layer. Thus, repetitive description with second embodiment will not be given.

Figure 20:
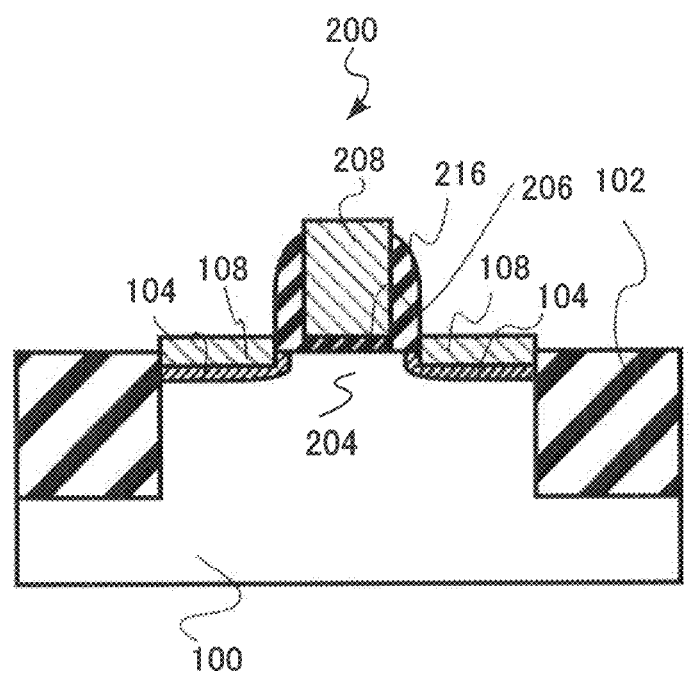
FIG. 20 is a sectional view showing a semiconductor device according to a fifth embodiment.

FIG. 20 is a sectional view showing a semiconductor device according to the fifth embodiment. This n-type MISFET 200 does not have the n-type impurity layer.

This embodiment may provide a MISFET with reduced short channel effect by omission of the n-type impurity layer, in addition to the function and effect of the second embodiment.

Sixth Embodiment

A semiconductor device according to a sixth embodiment is an n-type MISFET formed on a substrate having an SOI structure. It is same as second embodiment except for an SOI substrate. Thus, repetitive description with second embodiment will not be given.

Figure 21:
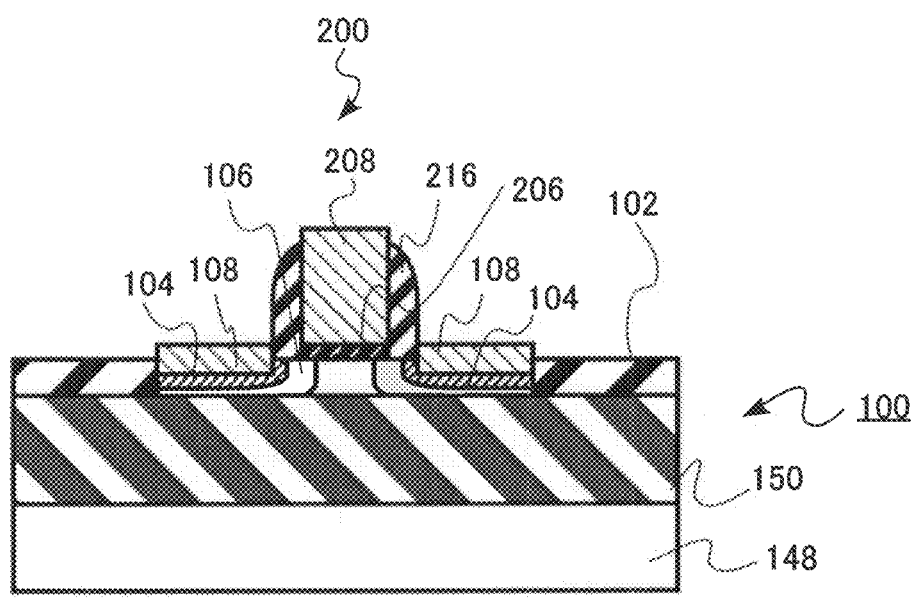
FIG. 21 is a sectional view showing a semiconductor device according to a sixth embodiment.

FIG. 21 is a sectional view showing a semiconductor device according to the sixth embodiment. This n-type MISFET 200 is formed on the silicon substrate 100 which has an SOI structure including a buried insulating film 150 formed on substrate 148.

According to this embodiment, in addition to the function and effect of the second embodiment, the n-type MISFET formed on an SOI substrate has a reduced short channel effect.

Seventh Embodiment

A semiconductor device according to a seventh embodiment has CMIS structure, that is, an n-type MISFET of the second embodiment and a p-type MISFET. Thus, repetitive description with second embodiment will not be given.

Figure 22:
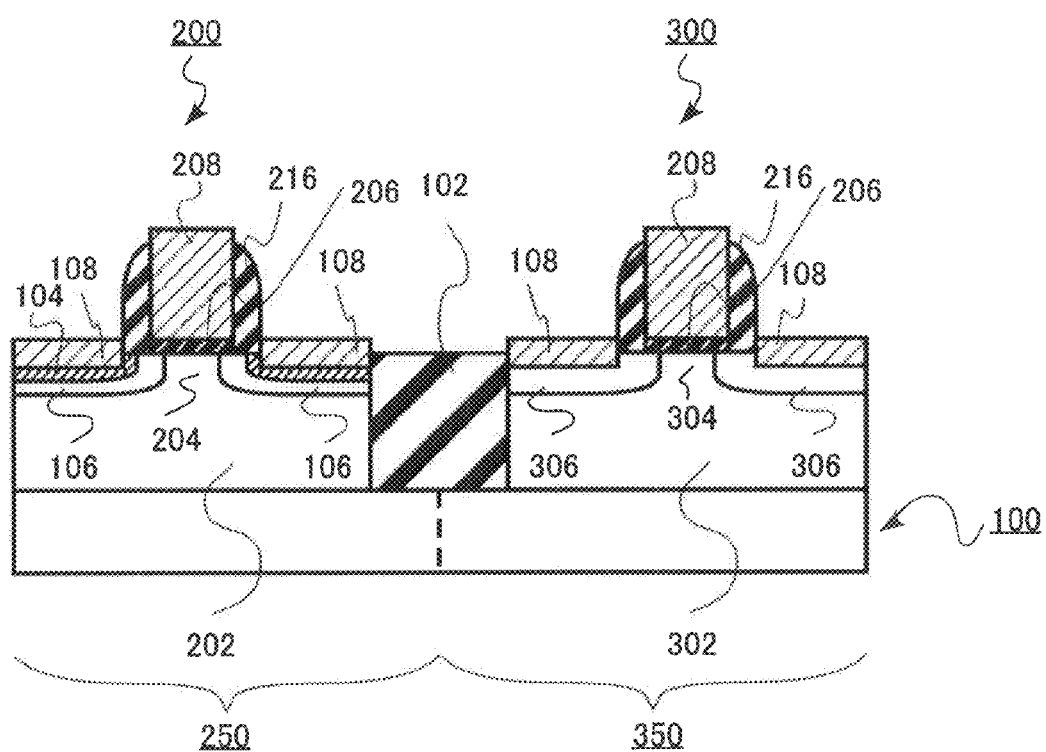
FIG. 22 is a sectional view showing a semiconductor device according to a seventh embodiment.
Figure 23:
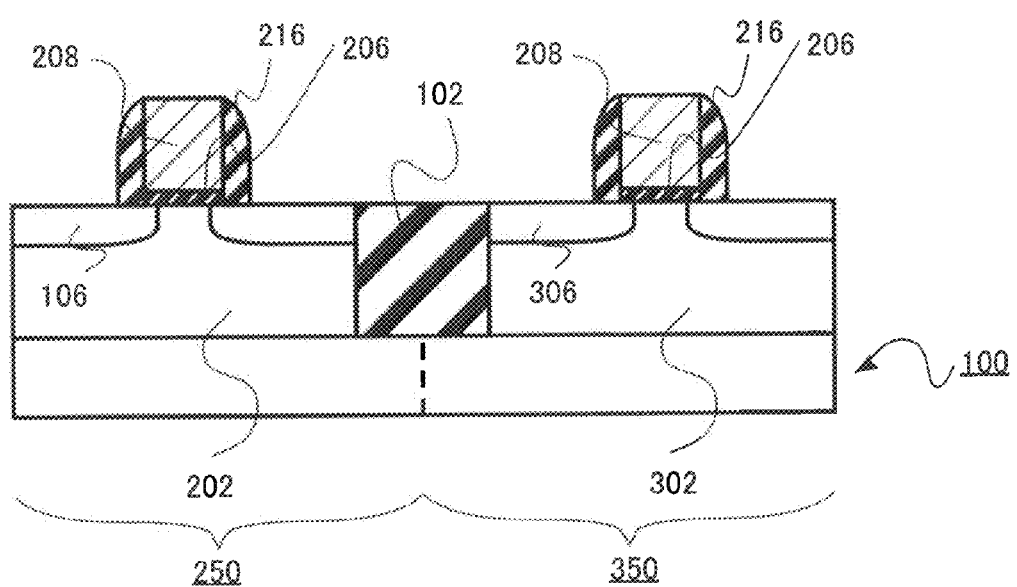
FIG. 23 to 26 are sectional views showing a manufacturing process of the semiconductor device according to the seventh embodiment.

FIG. 22 is a sectional view showing a semiconductor device according to the seventh embodiment. This device has an n-type MISFET 200 and a p-type MISFET 300 formed on Si substrate 100, for example.

N-type MISFET 200 is formed on p-type well 202 formed on Si substrate 100, and has same structure as the second embodiment.

P-type MISFET 300 is formed on n-type well 302 formed on Si substrate 100. P-type MISFET 300 has a channel region 304, a gate insulating film 206 formed on the channel region 304, and a gate electrode 208 formed on the gate insulating film 206. Source/drain electrodes made of NiSi layers 108 are formed on both sides of the channel region 304. P-type impurity layer 306 with an impurity such as B is formed on both sides of the channel region 304. Sidewall insulator 216, for example a silicon nitride film, is formed on both sides of gate electrode 208.

In what is called a CMIS circuit, which is a combination of an n-MISFET and a p-MISFET, generally, channel resistance of the n-type MISFET is extremely low. Thus, the problem of an interface resistance of silicide electrode for the n-MISFET tends to br more serious than that for the p-MISFET.

According to the embodiment, the interface resistance of n-type MISFET can be lowered selectively and easily. The n-type MISFET can obtain the same function and effect of the second embodiment.

Next, a method of the semiconductor device of this embodiment is explained. FIGS. 23 to 26 are cross sectional views of manufacturing processes of the method of manufacturing a semiconductor device of the seventh embodiment.

First, a device isolation region 102 is formed in a p-type silicon substrate 100. A device isolation region 102 is formed to divide first semiconductor region 250 for an n-type MISFET and second semiconductor region 350 for a p-type MISFET. After that a p-type well 202 and an n-type well 302 are formed by ion-implantation.

After that, gate insulating films 206 are formed on semiconductor regions 250 and 350. Next, polysilicon films serving as gate electrodes 208 are deposited on gate insulating films 206. Gate insulating films 206 and gate electrodes 208 are patterned by a lithography technique and an etching technique such as RIE.

Next, As is introduced into first semiconductor region 250 of the Si substrate 100 using the gate electrode 208 and resist as a mask. By this operation, n-type impurity layer 106 is formed. B is introduced into second semiconductor region 350 of the Si substrate 100 using the gate electrode 208 and resist as a mask. By this operation, p-type impurity layer 306 is formed.

Next, a silicon nitride film is deposited and etched back by RIE so that the silicon nitride film remains only on side faces of the gate electrodes 208. Gate side-wall insulating film 216 is formed.

Figure 24:
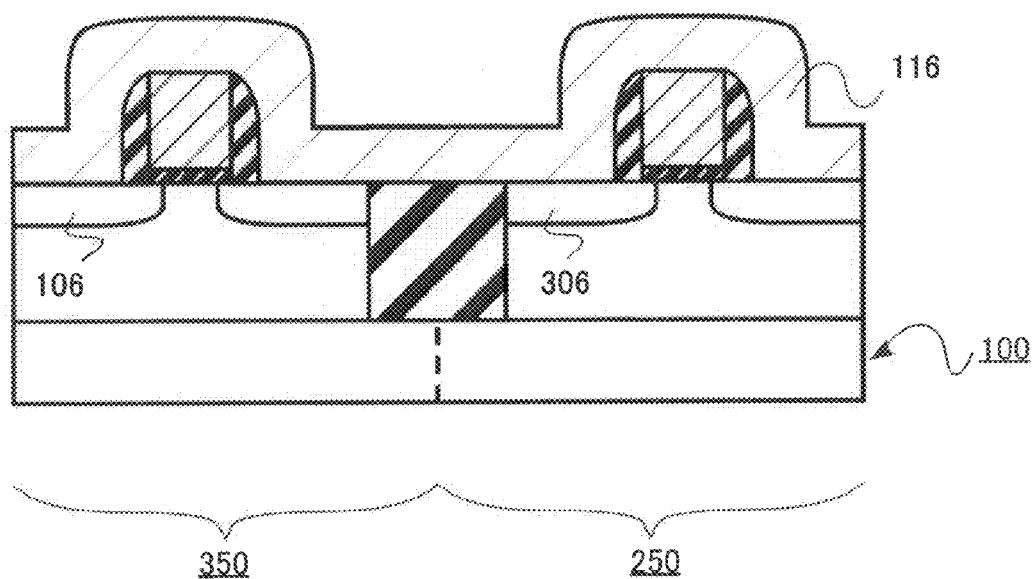

Next, as shown in FIG. 24, an Ni film 116 is formed on Si substrate 100. That is, it is deposited so that the Ni film 116 contacts with source and drain region of n-type MISFET.

Figure 25:
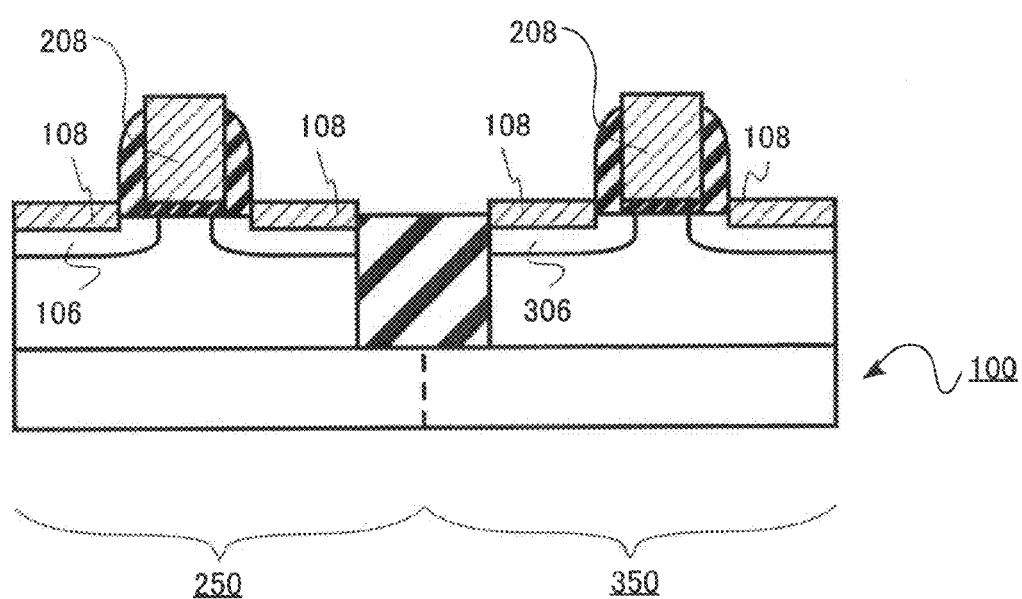

As shown in FIG. 25, a first heat treatment, such as annealing at 450° C. for 1 minute by RTA, is performed, and the NiSi layer 108 is formed by silicidation of Ni film 116. At the same time, all of gate electrodes 208 made of poly silicon become NiSi. After that, the unreacted and surplus Ni film 116 is selectively removed by chemical etching. This NiSi layer 108 serves as source/drain electrode of the n-type and p-type MISFET.

Figure 26:
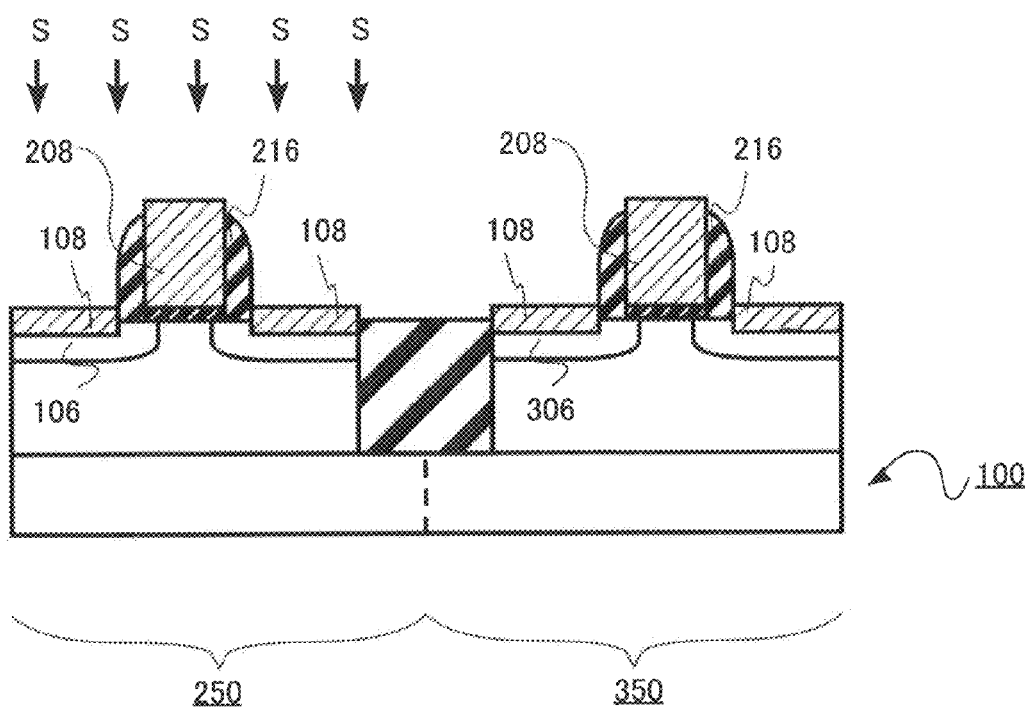

As shown in FIG. 26, S is ion-implanted selectively into the NiSi layer 108 using gate electrode 208, side-wall insulator 216 and resist as a mask. S is implanted with an acceleration voltage such that a Projected Range (Rp) is less than the film thickness of the NiSi layer 108.

After that, a second heat treatment, such as annealing at 500° C. for about 1 minute, is performed. By this heat treatment, the interface layer 104 with highly doped S is formed. As described above, the device having a CMIS structure shown in FIG. 22 is manufactured.

In the embodiment, a Si substrate is described as an example of the semiconductor substrate. However, It is also understood that a semiconductor substrate having same structure as FIG. 23, may have a p-type well 202 made of Si and an n-type well 302 made of $Si_xGe_{1-x}$ (0<x<1) or Ge. This semiconductor substrate optimizes carrier mobility of n-MISFET and p-MISFET respectively, and a high spec CMISFET can be realized.

Eighth Embodiment

A semiconductor device according to an eighth embodiment has CMIS structure, the n-type MISFET having an interface layer including S, and the p-type MISFET having an interface layer including at least one of the elements selected from such as Mg, Ca, Ba and B in high concentration of at least $1 \times 10^{20}$ atoms/cm$^3$. The eighth embodiment is the same as the seventh embodiment except for p-type MISFET. Thus, repetitive description with the seventh embodiment will not be given.

Figure 27:
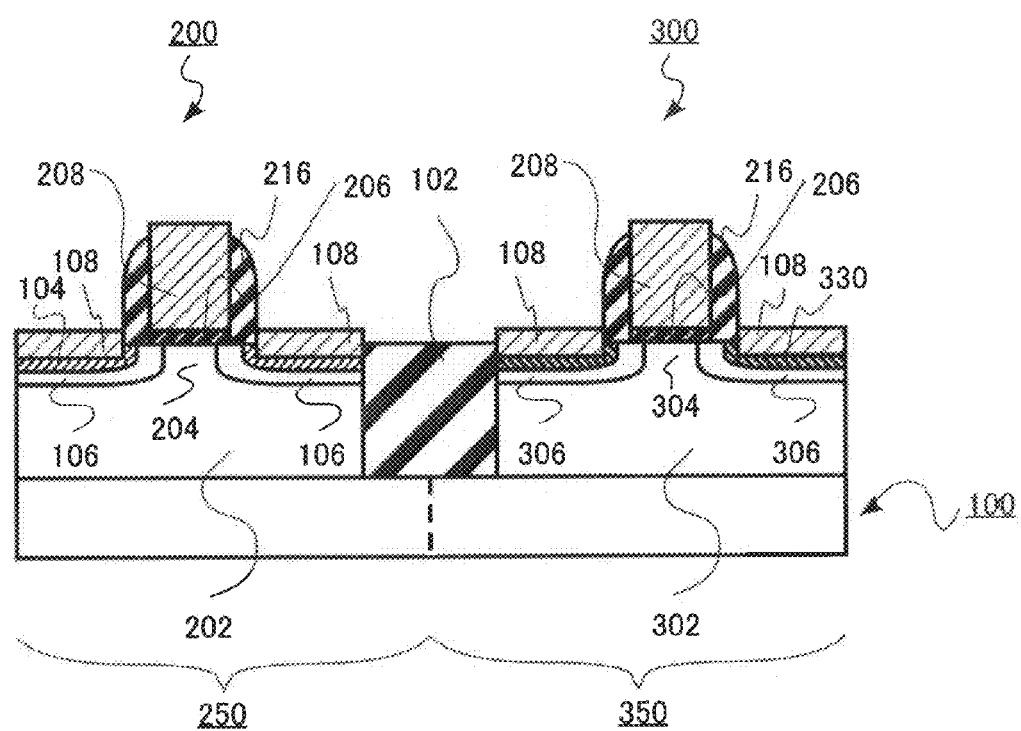
FIG. 27 is a sectional view showing a semiconductor device according to an eighth embodiment.

FIG. 27 is a sectional view showing a semiconductor device according to the eighth embodiment. This device has an n-type MISFET 200 and a p-type MISFET 300 formed on Si substrate 100, for example.

N-type MISFET 200 is formed on p-type well 202 formed on Si substrate 100, and has the same structure as the second embodiment. P-type MISFET 300 has the same structure as the seventh embodiment except for the interface layer 330 containing at least one element selected from such as Mg, Ca, Ba and B in a high concentration of at least $1 \times 10^{20}$ atoms/cm$^3$.

Figure 28:
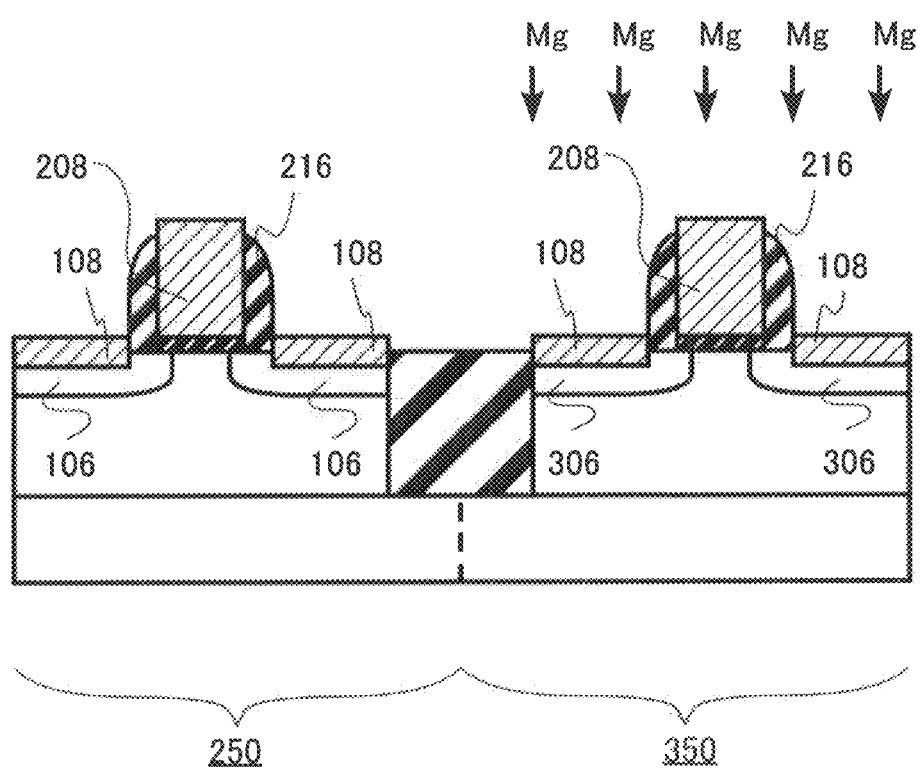
FIG. 28 is sectional view showing a manufacturing process of the semiconductor device according to the eighth embodiment.

Next, a method of manufacturing the semiconductor device of th eighth embodiment is explained. FIG. 28 is a cross sectional view of manufacturing processes of the method of manufacturing a semiconductor device of the eighth embodiment.

In the manufacturing method, after S ion-implantation as in the seventh embodiment, as shown in FIG. 28, at least one ion selected from such as Mg, Ca, Ba, B and BF2, and Mg is introduced selectively into the NiSi layer 108 of semiconductor region 350 by ion-implantation using gate electrode 208, side-wall insulator 216 and resist as a mask. The ions are implanted with an acceleration voltage such that the Projected Range (Rp) is less than the film thickness of the NiSi layer 108.

After that, a second heat treatment, such as annealing at 500° C. for about 1 minute, is performed. By this heat treatment, interface layer 104 with highly doped S is formed, and interface layer 330 highly doped with an element selected from such as Mg, Ca, Ba and B is formed by segregation thereof. As described the above, the device having CMIS structure shown in FIG. 27 is manufactured.

The ion-implanted acceptor such as Mg, Ca, Ba and B is segregated at the vicinity of the interface. Interface layer 330 containing the ion-implanted acceptor in high concentration decreases interface resistance of silicide electrode of p-type MISFET. That is, according to the eighth embodiment, interface resistance of the source/drain electrodes in both n-type MISFET and p-MISFET can decrease by a simple process. This embodiment may provide high-performance CMISFET with low contact resistance of source/drain electrodes in both n-type MISFET and p-type MISFET.

Ninth Embodiment

A semiconductor device according to a ninth embodiment has CMIS structure, and both n-type MISFET and p-type MISFET are Schottky transistors. It is same as the eighth embodiment except for both n-type MISFET and p-type MISFET are Schottky transistors, that is, they do riot have n-type impurity layer and p-type impurity layer respectively. Thus, repetitive description with the eighth embodiment will not be given.

Figure 29:
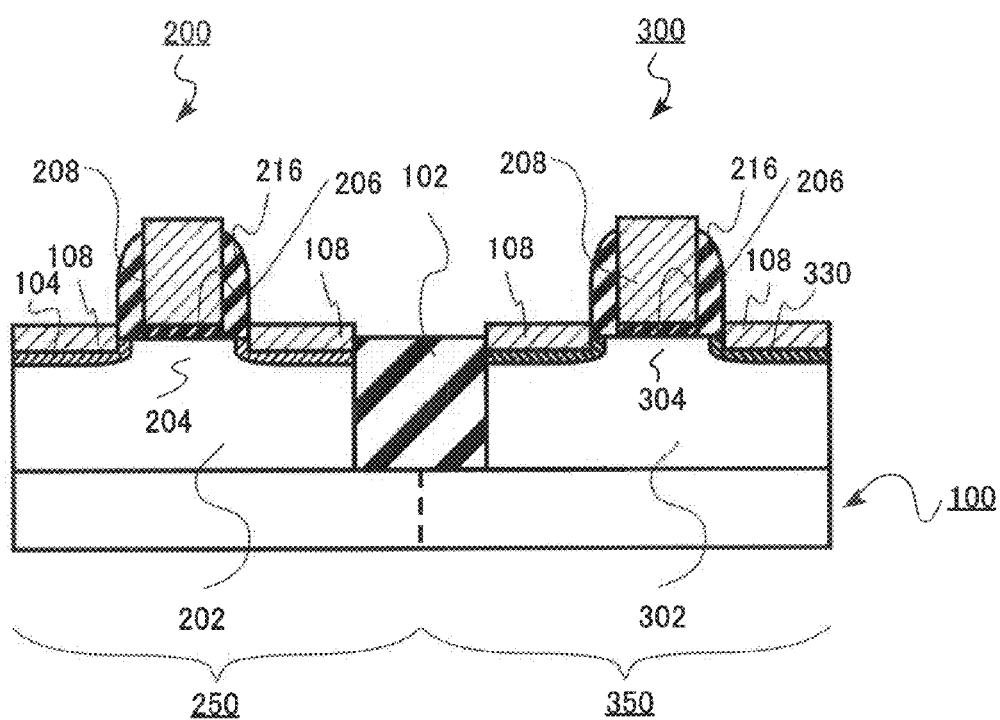
FIG. 29 is a sectional view showing a semiconductor device according to a ninth embodiment.

FIG. 29 is a sectional view showing a semiconductor device according to the ninth embodiment. N-type MISFET 200 is formed on p-type well 202 formed on Si substrate 100, and has same structure as the eighth embodiment except for omission of the n-type impurity layer. That is, N-type MISFET 200 is same as the n-type Schottky transistor described in the fifth embodiment.

P-type MISFET 300 has the same structure as the p-type MISFET of the eighth embodiment except for omission of the p-type impurity layer. That is, it is a segregated Schottky transistor with the interface layer 330 containing a p-type impurity such as Mg, Ca, Ba and B that is an acceptor.

A method of manufacturing the semiconductor device of the ninth embodiment is same as the method of manufacturing the eighth embodiment except that the forming process of n-type impurity layer and p-type impurity layer is omitted. This embodiment may provide a CMISFET with reduced short channel effect in both n-type MISFET and p-type MISFET, by omission of the n-type impurity layer, in addition to the function and effect of the eighth embodiment.

Tenth Embodiment

A semiconductor device according to the tenth embodiment has a CMIS structure, and both an n-type MISFET and p-type MISFET are segregated Schottky transistors. It is same as the ninth embodiment except for the n-type MISFET being a segregated Schottky transistor. Thus, repetitive description with the ninth embodiment will not be given.

Figure 30:
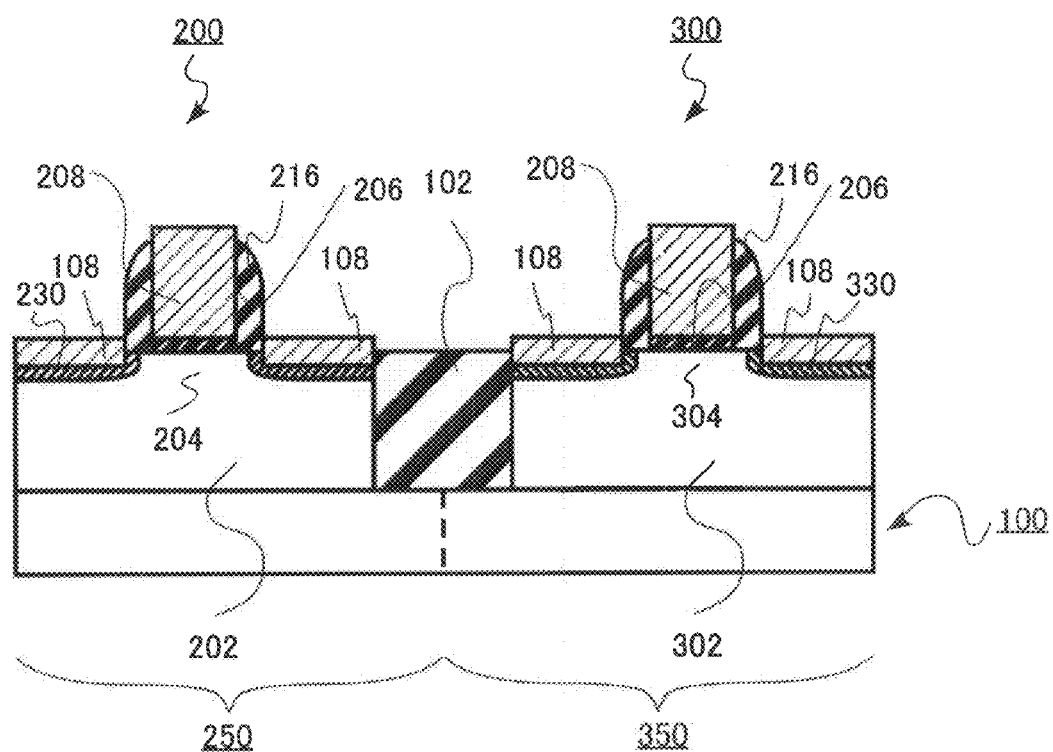
FIG. 30 is a sectional view showing a semiconductor device according to a tenth embodiment.

FIG. 30 is a sectional view showing a semiconductor device according to the tenth embodiment. N-type MISFET 200 has the same structure as the ninth embodiment except for As segregated in interface layer 230 in addition to S. That is, N-type MISFET 200 is the same as the n-type Schottky transistor described in the fourth embodiment.

P-type MISFET 300 is a segregated Schottky transistor with interface layer 330 that p-type acceptor is segregated. That is, it has the same structure as the p-type MISFET of the ninth embodiment.

A method of manufacturing the semiconductor device of this embodiment is same as method of the ninth embodiment except for As ion-implantation process before S ion-implantation into semiconductor region 250. According to the embodiment, in addition to the function and effect of the ninth embodiment, interface resistance of n-type MISFET improves more, by n-type segregated schottky transistor.

Eleventh Embodiment

A semiconductor device according to an eleventh embodiment is n-type MISFET having a FIN structure. It is the same as the second embodiment except for the FIN structure. Thus, repetitive description with the second embodiment will not be given.

Figure 31:
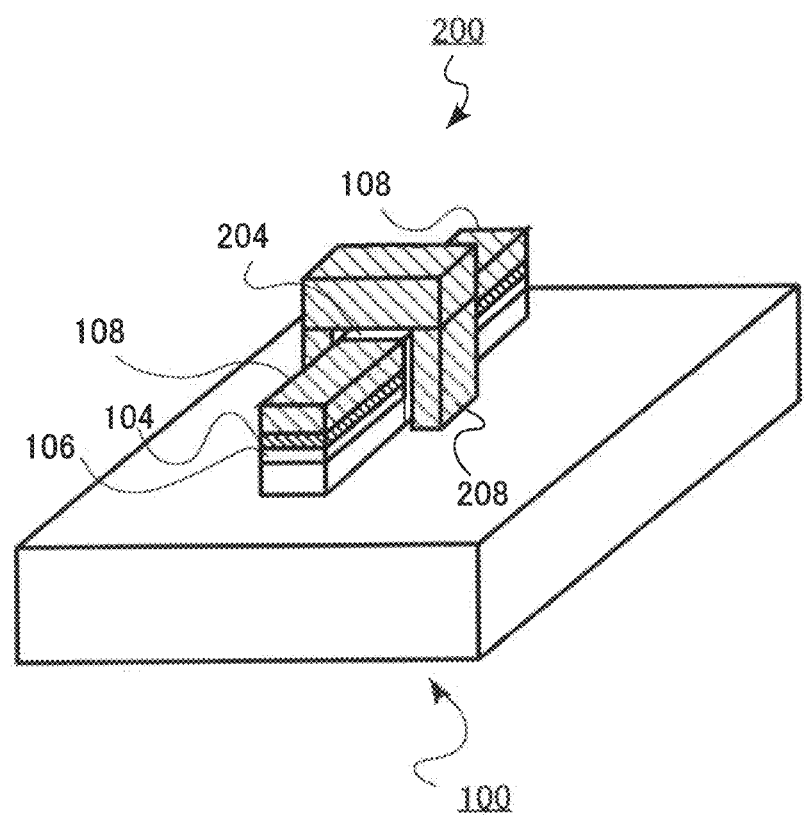
FIG. 31 is a perspective view showing a semiconductor device according to an eleventh embodiment.

FIG. 31 is a perspective view showing a semiconductor device according to the eleventh embodiment.

As shown in FIG. 31, the device of this embodiment has n-type MISFET 200 having a FIN structure formed on Si substrate 100. N-type MISFET 200 has a source/drain electrode, for example, made of NiSi layer 108, sandwiched between channel region 204 and interface layer 104 containing S in high concentration.

Channel region 204 has a FIN shape perpendicular to silicon substrate 100, having two side faces opposite each other. A gate insulating film, such as silicon oxide is formed on these two side faces respectively. Gate electrode 208 made of NiSi is formed on the gate insulating film. The n-type MISFET of the eleventh embodiment is called FIN-MISFET with a double gate structure.

FIN-MISFET has a strong gate control, suppressed drain induced barrier lowering, and reduced short channel effect.

This embodiment may provide MISFET with low short channel effect, in addition to the function and effect of second embodiment.

The embodiments of the present invention have been described above with the concrete examples. However, the embodiments have been described as examples and do not limit the present invention. In the description of the embodiments, parts which are not directly necessary for the description of the present invention, in the semiconductor devices, the methods of manufacturing semiconductor devices, and the like are not described. The elements related to the semiconductor devices, the methods of manufacturing semiconductor devices, and the like which are necessary can be properly and selectively used.

All of semiconductor devices each having the elements of the present invention and methods of manufacturing semiconductor devices which can be properly modified by a person skilled in the art are included in the scope of the present invention.

For example, in the embodiments, the case where the material of the semiconductor substrate is Si (silicon) has been described. The present invention can be also applied to a semiconductor substrate made of another semiconductor material such as $Si_xGe_{1-x}$ ($0 \leq x < 1$), SiC, Ge, or the like. The present invention can be also applied to source/drain region of MISFET formed on Si substrate, made of another semiconductor material such as $Si_xGe_{1-x}$ ($0 \leq x < 1$), SiC, Ge, or the like.

An element of each embodiments described above can be applied to other embodiments.

The scope of the present invention is defined by the scope of the claims and the scope of equivalence of the claims.

The invention claimed is:

1. A semiconductor device, comprising:
a semiconductor substrate;
a metal-semiconductor compound layer formed on the semiconductor substrate and including in the whole depth of the metal-semiconductor compound layer at least $1 \times 10^{20}$ atoms/cm$^3$ of S (Sulfur) introduced into the metal-semiconductor compound layer after formation of the metal-semiconductor compound layer on the semiconductor substrate;
an interface layer formed on the semiconductor substrate by heat treatment of said S containing metal-semiconductor compound layer formed on semiconductor substrate, the interface layer including at least $1 \times 10^{20}$ atoms/cm$^3$ of S, a Schottky barrier height between said semiconductor substrate and said metal-semiconductor compound layer being below 0.01 eV; and
a metal electrode formed on the metal-semiconductor compound layer.

2. The device according to claim 1, wherein the interface layer includes at least $1 \times 10^{20}$ atoms/cm$^3$ of an n-type impurity.

3. The device according to claim 1, wherein the semiconductor substrate is a Si substrate, and the metal-semiconductor compound layer is a NiSi layer including Pt.

4. The device according to claim 1, wherein the S concentration in the semiconductor substrate is less than $1 \times 10^{18}$ at a depth of 40 nm measured from a boundary between the metal semiconductor compound layer and the semiconductor substrate.

5. A semiconductor device, comprising:
a semiconductor substrate;
a channel region formed in the semiconductor substrate;
a gate insulating film formed on the channel region;
a gate electrode formed on the gate insulating film;
source/drain electrodes formed on both sides of the channel region, each source/drain electrode being made of a metal-semiconductor compound layer formed on the semiconductor substrate and including in the whole depth of the metal-semiconductor compound layer at least $1\times10^{20}$ atoms/cm$^3$ of S (Sulfur) introduced into the metal-semiconductor compounds layer after formation of the metal-semiconductor compound layer on the semiconductor substrate; and
interface layers formed between the metal-semiconductor compound layers and the semiconductor substrate by heat treatment of said S containing metal-semiconductor compound layer formed on semiconductor substrate, each interface layer including at least $1\times10^{20}$ atoms/cm$^3$ of S, a Schottky barrier height between said semiconductor substrate and said metal-semiconductor compound layer being below 0.01 eV.

6. The device according to claim 5, wherein each interface layer includes at least $1\times10^{20}$ atoms/cm$^3$ of an n-type impurity.

7. The device according to claim 5, wherein the semiconductor substrate is a Si substrate, and the metal-semiconductor compound layers are NiSi layers including Pt.

8. The device according to claim 5, wherein the S concentration in the semiconductor substrate is less than $1\times10^{18}$ at a depth of 40 nm measured from a boundary between the metal semiconductor compound layer and the semiconductor substrate.

* * * * *